United States Patent [19]

Kecmer

[11] Patent Number: 4,914,552
[45] Date of Patent: Apr. 3, 1990

[54] PRINTED CIRCUIT BOARD INSTALLATION AND RETAINING APPARATUS

[75] Inventor: Robert P. Kecmer, Fair Lawn, N.J.

[73] Assignee: Rexnord Holdings Inc., Torrance, Calif.

[21] Appl. No.: 371,213

[22] Filed: Jun. 26, 1989

[51] Int. Cl.⁴ .............................................. H05K 7/14
[52] U.S. Cl. ..................................... 361/415; 211/41; 361/412; 361/391
[58] Field of Search ................... 211/41; 361/386–389, 361/391, 412, 415; 439/153, 157, 160, 377

[56] References Cited

U.S. PATENT DOCUMENTS

| | | | |
|---|---|---|---|
| 4,152,038 | 5/1979 | Inouye et al. | 439/153 |
| 4,157,583 | 6/1979 | Basmajian et al. | 361/399 |
| 4,313,150 | 1/1982 | Chu | 361/399 |
| 4,318,157 | 3/1982 | Rank et al. | 361/386 |
| 4,537,454 | 8/1985 | Dauty et al. | 439/157 |
| 4,632,588 | 12/1986 | Fitzpatrick | 361/399 |
| 4,775,260 | 10/1988 | Kecmer | 403/409.1 |

FOREIGN PATENT DOCUMENTS 3013023 10/1981 Fed. Rep. of Germany ...... 361/399

OTHER PUBLICATIONS

"Technical Support Package for Ejection Mechanism for Circuit Boards," NASA Tech Briefs, vol. 10, No. 2.

Primary Examiner—Gregory D. Thompson
Attorney, Agent, or Firm—Pretty, Schroeder, Brueggemann & Clark

[57] ABSTRACT

A retainer apparatus for conveniently installing and retaining a printed circuit board within a housing. The apparatus includes a lever mounted on the board and a cooperating gear assembly carried by the board and the housing for use in manually installing the board in, or removing the board from, the housing. A conventional locking wedge assembly can be manually operated by the same lever, to retain the printed circuit board within the housing after its installation.

7 Claims, 2 Drawing Sheets

PRINTED CIRCUIT BOARD INSTALLATION AND RETAINING APPARATUS

BACKGROUND OF THE INVENTION

This invention relates generally to apparatus for installing and removing printed circuit boards from a housing and, more particularly, to apparatus of the kind that further function to lock the boards in place.

Printed circuit (PC) boards are a well known form of electrical circuit packaging. Typically, PC boards carry along their lower edge a set of electrical contacts adapted to engage a mating set of contacts carried on a chassis. PC boards can be very large and require the use of a large number of such electrical contacts. As the number of mating electrical connections increases, the force required for inserting the board into the chassis to make the connection increases correspondingly, and can sometimes exceed 100 lbs. In addition to requiring a greater insertion force, the accuracy that is required in mating the electrical contacts is more difficult to achieve because of the greater number of simultaneous contacts that must be made. In addition, the individual electrical contact pins can be easily damaged by improper insertion.

One prior apparatus for installing PC boards with the required force and accuracy is shown in U.S. Pat. No. 4,318,157 to Rank, et al. The disclosed apparatus includes a jack screw that requires the use of a wrench or screwdriver to operate and, therefore, is not considered self-contained. Additionally, when two of such apparatus are mounted on a single PC board, the user must rotate both jack screws simultaneously in order to achieve proper insertion, a process that can be difficult to carry out properly and that can result in improper mating.

Other prior apparatus of this kind utilize levers to load the boards, but they generally provide an insufficient insertion force for use with larger PC boards. These levers often are attached to the PC board close to the edge carrying the electrical connector. This location makes it difficult to combine the lever with other devices, such as those that lock the PC board in place, reduce vibration, and increase heat transfer.

It should, therefore, be appreciated that there is a need for a PC board retaining apparatus that avoids the above difficulties. Ideally, the apparatus should be capable of applying large insertion forces to the PC board's electrical connector, while at the same time providing a high degree of accuracy in aligning the mating electrical connectors. Additionally, the apparatus should be operable without the need for separate tools and should be capable of functioning in combination with other PC board devices, such as those intended to lock the board in place, reduce vibration, and increase heat transfer. These benefits are all provided by the present invention.

SUMMARY OF THE INVENTION

The present invention is embodied in a retainer apparatus for installing and retaining printed circuit (PC) board in an installation position in a housing, which forcibly connects mating electrical connectors carried by the board and the housing and locks the board in place, and which functions without the need for any additional tools. The apparatus further prevents damage the electrical connectors by applying forces in a controlled, accurate manner during the installation and removal process.

More particularly, the retainer apparatus of the invention includes a rod mounted along one side edge of the PC board, for rotation about a longitudinal axis to clamp the board within a slot in the housing, and a lever pivotally secured to an end the rod opposite the board's electrical connector. Interlocking gear means, carried by the lever and the housing and operable while the lever is being pivoted from a raised position to a lowered position, forcibly drives the PC board into its installation position.

In a more detailed feature of the invention, the interlocking gear means includes a rack slidably mounted on the housing. The lever carries a set of teeth of the size to engage the rack. The slidable mounting of the rack allows the rack to be selectively moved into a position where the lever and the rack engage to forcibly drive the PC board into its installation position, and to be moved out of such position so as to prevent the PC board's removal.

The lever and the PC board cooperate in securing the lever in a lowered position when the lever is not being used to inject or eject the PC board. A wedge locking mechanism, actuated by rotating the rod about its longitudinal axis, is used to lock the PC board within the housing, reduce vibration, and increase heat transfer.

Other aspects and advantages of the present invention will become apparent from the following description of the preferred embodiment, taken in conjunction with the accompanying drawings, which illustrate, by way of example, the principles of the invention.

DESCRIPTION OF THE PREFERRED EMBODIMENT

Figure 1:
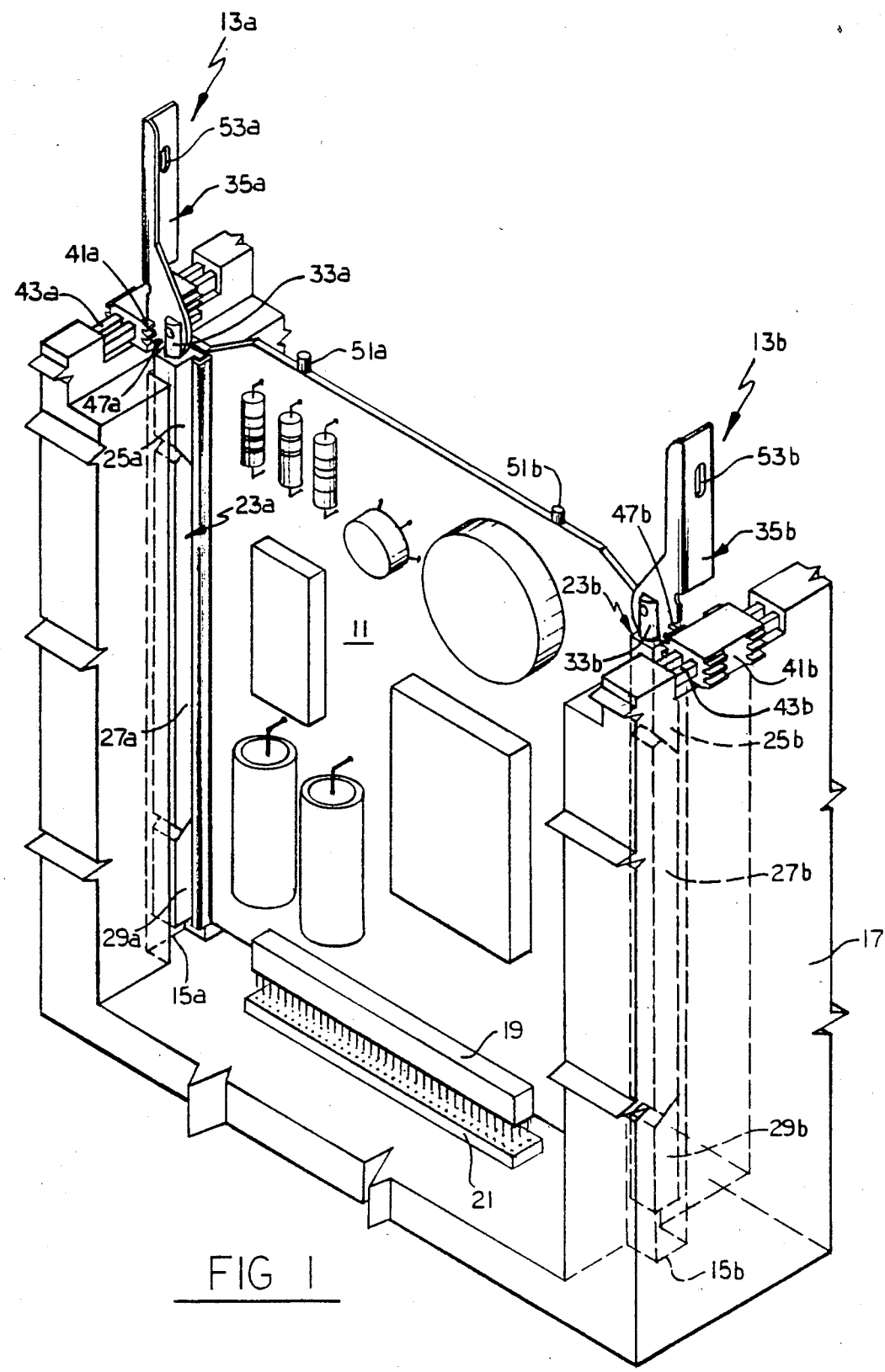
FIG. 1 is a perspective view of a printed circuit board carrying two retainer assemblies for selectively installing the board within a housing.

With reference now to the drawings, and particularly to FIG. 1, there is shown a printed circuit (PC) board 11 having left and right retainer assemblies 13a and 13b for use in installing and retaining the board in two opposed elongated slots 15a and 15b formed in a housing 17. The PC board is generally rectangular, with a separate retainer assembly carried along each side edge and with an electrical connector 19 carried on its lower edge, for coupling with a mating electrical connector 21 carried on a lower part of the housing. The two retainer assemblies cooperate with each other in guiding the PC board downwardly relative to the housing, to forcibly couple together the two electrical connectors, and thereafter in rigidly securing the PC board's opposite side edges within the two housing slots.

The two retainer assemblies 13a and 13b are substantially mirror images of each other and will be described in detail with reference to the assembly 13a depicted on the left side of the PC board 11 in FIG. 1. Components of the assembly 13a are identified by reference numerals having the suffix "a," while corresponding components of the assembly 13b are identified by the same reference numerals, but with the suffix "b."

Figure 6:
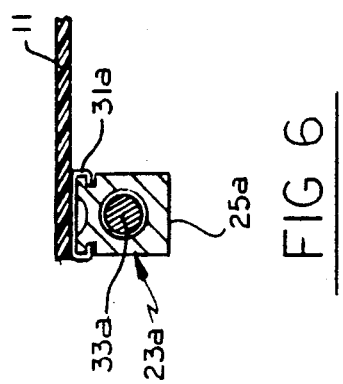
FIG. 6 is a sectional view of the locking wedge fastener, taken substantially in the direction of the arrows 6—6 in FIG. 4.

More particularly, the retainer assembly 13a includes a conventional locking wedge fastener 23a of the kind that includes three elongated wedges 25a, 27a and 29a oriented end-to-end and abutting each other with sloped surfaces. The three wedges are slidably received by a channel 31a (FIG. 6) that is secured, for example by rivets (not shown), to a side edge of the PC board 11. A rod 33a extends axially through the three wedges such that a clockwise rotation of the rod draws the two end wedges 25a and 29a toward each other, to urge the middle wedge 27a transversely and thus increase the fastener's effective thickness. Conversely, rotating the rod in a counterclockwise direction moves the two end wedge elements apart from each other, to reduce the assembly's effective thickness. In use, after the PC board has been fully installed in the housing 17, with the two electrical connectors 19 and 21 properly coupled together, the rods 33a and 33b of the two locking wedge fasteners 23a and 23b are together rotated clockwise about their longitudinal axes. This tightens the two wedge fasteners, and thus the PC board, within the respective housing slots 15a and 15b.

In accordance with the invention, the two retainer assemblies 13a and 13b are both further adapted to co-operate in initially installing the PC board 11 in the housing 17, i.e., in lowering the board into the housing and forcibly coupling together the two electrical connectors 19 and 21. In particular, and again with reference specifically to the retainer assembly 13a depicted on the let side of the PC board in FIG. 1, the assembly includes a lever 35a pivotally secured via a pin 37a within a vertically-aligned slot 39a at the upper end of the rod 33a. A rack gear 41a is slidably mounted on a rail 43a oriented substantially perpendicular to the plane of the PC board, at the top of the elongated slot 15a. The lever includes a manually graspable handle or arm 45a and a circular gear segment 47a centered on the lever's pivot axis and projecting in a direction away from the arm. The lever arm includes a 90-degree bend along its length, to provide structural strength and resistance to bending. The lever can be selectively pivoted about the pin 37a, between a lowered orientation where the arm is perpendicular to the rod 33a and a raised orientation where the arm is axially aligned with the rod.

Figure 3:
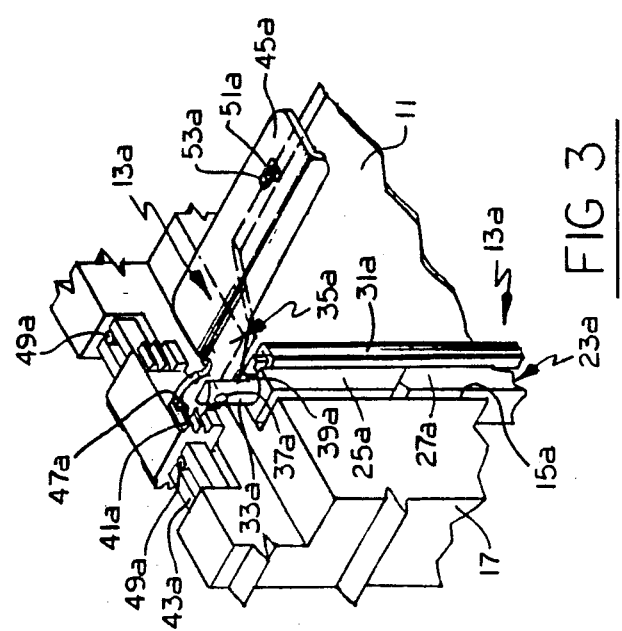
FIG. 3 is a fragmentary perspective view similar to FIG. 2, but after the lever arm has been pivoted downwardly to forcibly insert the printed circuit board into the housing.
Figure 2:
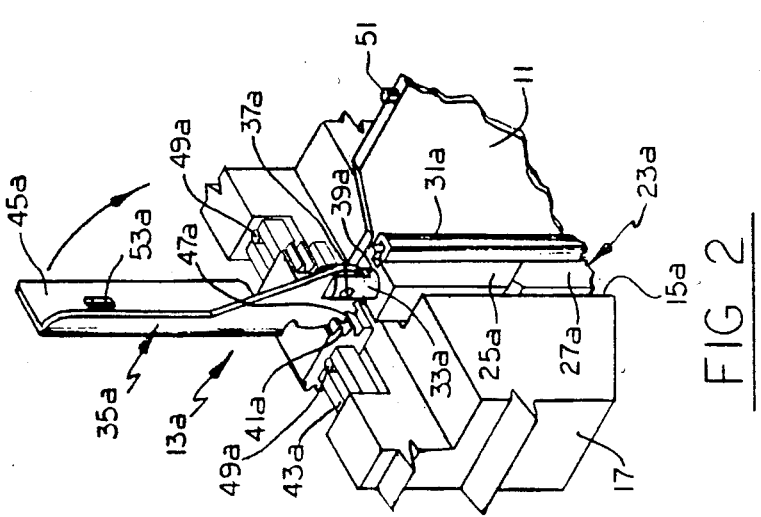
FIG. 2 is a fragmentary perspective view of an upper portion of the printed circuit board and housing, showing one retainer assembly, with its lever arm pivoted upwardly and the rack gear positioned adjacent to it, preparatory to inserting the board into the housing.

In use, when the PC board 11 is to be installed in the housing 17, the lever arms 45a and 45b are pivoted upwardly to their raised orientations and the rack gears 41a and 41b are slid along their respective rails 43a and 43b into positions immediately adjacent to their corresponding rods 33a and 33b and levers 35a and 35b. Stops 49a limit movement of the rack gear along the rail. This position for the components of the left-side retainer assembly 13a is depicted in FIG. 2. From this position, the two lever arms can be manually pivoted downwardly such that the circular gear segments 47a and 47b engage their corresponding rack gears and forcibly drive the PC board downwardly, to couple together the two electrical connectors 19 and 21. This lowered position for the components of the left-side retainer assembly 13a is depicted in FIG. 3. The mechanical advantage provided by the levers enable the board to be forcibly inserted in this fashion using merely a manual force applied to the two lever arms. In addition, a full pivot of the lever arms from their raised positions (FIG. 2) to their lowered positions (FIG. 3) controllably lowers the PC board by a specific, limited distance, thus minimizing the possibility of damaging the electrical connectors.

Figure 4:
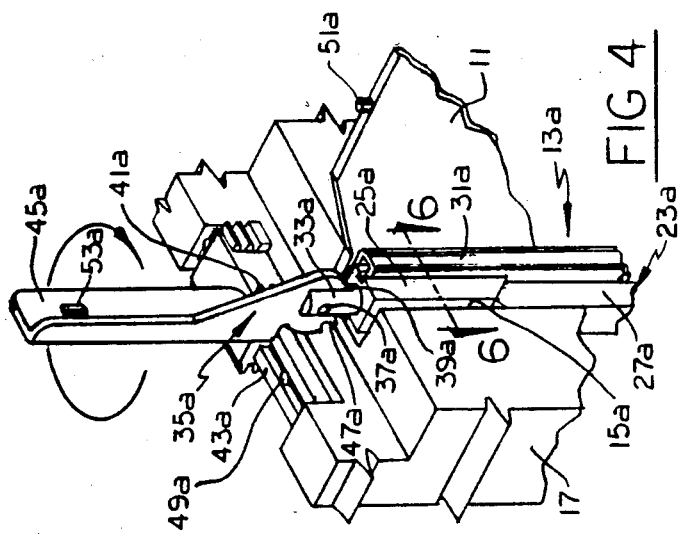
FIG. 4 is a fragmentary perspective view similar to FIGS. 2 and 3, but after the rack gear has been slid out of alignment with the lever and the lever arm has been pivoted upwardly and rotated so as to actuate the associated locking wedge fastener and thereby retain the printed circuit board in the housing.

Thereafter, the two rack gears 41a and 41b are slid along their respective rails 43a and 43b out of alignment with their corresponding circular gear segments 47a and 47b. The two lever arms 45a and 45b ar then pivoted upwardly, this time with the gear segments not engaged with their corresponding rack gears. The resulting raised position for the components of the left side retainer assembly 13a is depicted in FIG. 4. The two lever arms are then rotated a plurality of full revolutions about the longitudinal axes of their corresponding rods 33a and 33b, to operate the locking wedge fasteners 23a and 23b and thereby retain those fasteners, and thus the PC board 11, within the two housing slots 15a and 15b.

Figure 5:
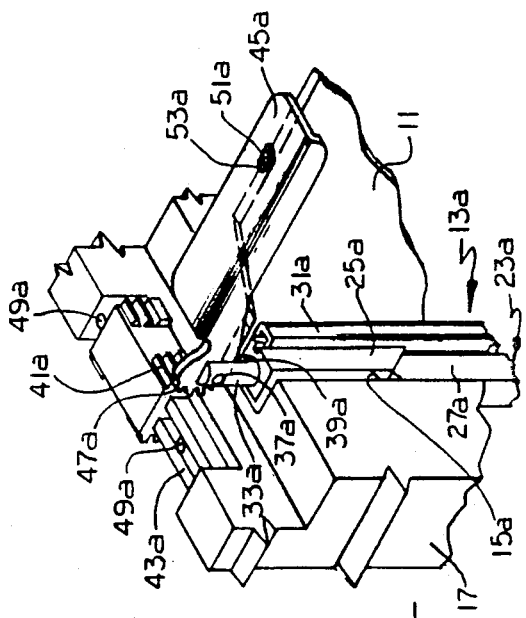
FIG. 5 is a fragmentary perspective view similar to FIGS. 2-4, but after the lever arm has again been pivoted downwardly into its locked position.

Finally, the two lever arms 45a and 45b are again pivoted downwardly, with the two rack gears 41a and 41b remaining out of alignment with the corresponding circular gear segments 47a and 47b. The resulting lowered position for the components of the left-side retainer assembly 13a is depicted in FIG. 5. Pins 51a and 51b projecting upwardly from the upper edge of the PC board 11 are received by corresponding slots 53a and 53b formed in the two lever arms 45a and 45b, respectively. This prevents the two lever arms from inadvertently rotating about the longitudinal axes of their corresponding rods 33a and 33b, after the PC board has been fully installed and retained within the housing 17.

To release the PC board 11 from the housing 17, a reverse of the sequence described above is followed. In particular, the lever arms 45a and 45b are first pivoted upwardly and then rotated counterclockwise about the longitudinal axes of the corresponding rods 33a and 33b, to loosen the locking wedge fasteners 23a and 23b. Thereafter, the lever arms are pivoted downwardly and the rack gears 41a and 41b then slid along their respective rails 43a and 43b into alignment with their corresponding circular gear segments 47a and 47b. The two lever arms are then pivoted again upwardly, this time with the gear segments engaging the corresponding rack gears so as to raise the PC board relative to the housing. The PC board is then easily lifted away from the housing.

It should be appreciated from the foregoing description that the present invention provides an improved retainer apparatus for conveniently installing and retaining a printed circuit board within a housing. The apparatus includes a lever mounted on the board and a cooperating gear assembly carried by the board and the housing for use in manually installing the board in, or removing the board from, the housing. A conventional locking wedge assembly can be manually operated by the same lever, to retain the printed circuit board within the housing after its installation. The apparatus thereby can be conveniently operated to install and retain the printed circuit board without the need for any separate tools and with minimal risk of damage to the board's electrical connector.

Although the invention has been described in detail with reference only to the preferred embodiment, those of ordinary skill in the art will appreciate that various modifications can be made without departing from the invention. Accordingly, the invention is defined only by the following claims.

What is claimed is:

1. Retainer apparatus for use in installing and retaining a printed circuit board in a predetermined installation position within a first slot formed in a housing, wherein the printed circuit board is generally rectangular, with two opposite side edges, a lower edge, and an upper edge, and wherein the lower edge of the printed circuit board and the housing together carry mating electrical connectors that are guided into coupling with each other as the board is moved into its predetermined installation position, the retainer apparatus comprising:

clamping means adapted for clamping the board within the first slot of the housing, said clamping means including a rod adapted to be mounted along one side edge of the printed circuit board for rotation about a longitudinal axis to activate or deactivate said clamping means;

a lever having a pivot point pivotally secured to the rod at the end of the rod nearest the upper edge of the printed circuit board, wherein the lever is selectively pivotable between a raised position and a lowered position, and wherein the lever is selectively rotatable with the rod about the rod's longitudinal axis; and interlocking gear means carried by the lever and the housing and selectively operable while the lever is being pivoted from its raised position to its lowered position to drive the printed circuit board into its predetermined installation position.

2. The retainer apparatus of claim 1, wherein the clamping means further includes wedge fastening means associated with the rod and adapted to clamp the printed circuit board within the first slot of the housing when the rod is rotated in one direction about its longitudinal axis and adapted to release the printed circuit board from the first slot of the housing when the rod is rotated in the opposite direction about its longitudinal axis.

3. The retainer apparatus of claim 1, wherein:

the housing further includes a second slot, spaced opposite from the first slot; and second clamping means adapted for clamping the board within the second slot of the housing, said second clamping means including a second rod adapted to be mounted along the opposite side edge of the printed circuit board for rotation about a longitudinal axis to activate or deactivate said second clamping means, a second lever having a pivot point pivotally secured to the second rod at the end of the second rod nearest the upper edge of the printed circuit board, wherein the second lever is selectively movable between a raised position and a lowered position, and wherein the second lever is selectively rotatable with the second rod about the second rod's longitudinal axis, second interlocking gear means carried by the second lever and the housing and selectively operable while the second lever is being pivoted from its raised position to its lowered position to drive the printed circuit board into its predetermined installation position.

4. Retainer apparatus for use in installing and retaining a printed circuit board in a predetermined installation position within a slot formed in a housing, wherein the printed circuit board is generally rectangular, with two opposite side edges, a lower edge, and an upper edge, and wherein the lower edge of the printed circuit board and the housing together carry mating electrical connectors that are guided into coupling with each other as the board is moved into its predetermined installation position, the retainer apparatus comprising:

clamping means adapted for clamping the board within the first slot of the housing, said clamping means including a rod adapted to be mounted along one side edge of the printed circuit board for rotation about a longitudinal axis to activate or deactivate said clamping means;

a lever having a pivot point pivotally secured to the rod at the end of the rod nearest the upper edge of the printed circuit board, wherein the lever is selectively pivotable between a raised position and a lowered position; and interlocking gear means carried by the lever and the housing and including a tooth located at one end of the lever, and a rack, slidably mounted on the housing, for selective engagement with the tooth on the lever, adapted to drive the printed circuit board into its predetermined installation position as the lever is being pivoted from its raised position to its lowered position.

5. The retainer apparatus of claim 4, wherein the interlocking gear means further comprises a plurality of teeth located at said one end of the lever, uniformly spaced from the lever's pivot point, for selective engagement with the rack to drive the printed circuit board into its predetermined installation position as the lever is being pivoted from its raised position to its lowered position.

6. The retainer apparatus of claim 4, and further comprising an elongated track mounted on the housing, on which the rack is slidably mounted, permitting the rack to slide into and out of a position where it can engage the tooth on the lever.

7. Retainer apparatus for use in installing and retaining a printed circuit board in a predetermined installation position within a slot formed in a housing, wherein the printed circuit board is generally rectangular, with side edges, a lower edge, and an upper edge, and wherein the lower edge of the printed circuit board and the housing together carry mating electrical connectors that are guided into coupling with each other as the board is moved into its predetermined installation position, the retainer apparatus comprising:

a rod, adapted to be mounted along one side edge of the printed circuit board for rotation about a longitudinal axis;

wedge fastening means associated with the rod and adapted to clamp the printed circuit board within the housing slot when the rod is rotated in one direction about its longitudinal axis and to release the printed circuit board from the housing slot when the rod is rotate in the opposite direction about its longitudinal, axis;

a lever having a pivot point pivotally secured to the rod at the end of the rod nearest the upper edge of the printed circuit board, wherein the lever is selectively movable between a raised position and a lowered position; and interlocking means carried by the lever and the housing add selectively operable while the lever is being pivoted from its raised position to its lowered position to drive the printed circuit board into its predetermined installation position, the interlocking gear means including a plurality of teeth located at one end of the lever, uniformly spaced from the lever's pivot point, a rack, slidably mounted on the housing, for selective engagement with the plurality of teeth on the lever, such that pivoting the lever from its raised position to its lowered position drives the printed circuit board into its predetermined installation position, and an elongated track mounted on the housing, on which the rack is slidably mounted, permitting the rack to slide into and out of a position where it can engage the plurality of teeth on the lever.

* * * * *